US009337800B1

(12) United States Patent  
Olsson, III et al.

(10) Patent No.: US 9,337,800 B1  
(45) Date of Patent: May 10, 2016

(54) MICRORESONATOR ELECTRODE DESIGN

(71) Applicant: Sandia Corporation, Albuquerque, NM (US)

(72) Inventors: Roy H. Olsson, III, Albuquerque, NM (US); Kenneth Wojciechowski, Albuquerque, NM (US); Darren W. Branch, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 373 days.

(21) Appl. No.: 13/649,025

(22) Filed: Oct. 10, 2012

Related U.S. Application Data

(60) Provisional application No. 61/546,432, filed on Oct. 12, 2011.

(51) Int. Cl.  
*H03H 9/02* (2006.01)  
*H03H 9/17* (2006.01)  
*H03H 9/46* (2006.01)  
*H03H 9/54* (2006.01)  
*H03H 9/13* (2006.01)  
*H03H 9/15* (2006.01)

(52) U.S. Cl.  
CPC .......... *H03H 9/02275* (2013.01); *H03H 9/0211* (2013.01); *H03H 9/132* (2013.01); *H03H 9/17* (2013.01); *H03H 9/462* (2013.01); *H03H 9/54* (2013.01); *H03H 2009/155* (2013.01)

(58) Field of Classification Search  
CPC .......... H03H 9/00; H03H 2009/02496; H03H 9/6483; H03H 9/6436; H03H 9/17; H03H 9/171; H03H 9/15; H03H 9/02; H03H 9/0211; H03H 9/02015

USPC .......................................... 333/186–187, 195  
See application file for complete search history.

(56) References Cited

U.S. PATENT DOCUMENTS

| | | | |
|---|---|---|---|
| 7,170,371 B2 * | 1/2007 | Ueda et al. .................... 333/195 |
| 7,812,680 B1 | 10/2010 | Brown et al. | |
| 7,915,974 B2 * | 3/2011 | Piazza et al. .................. 333/186 |
| 8,159,109 B2 | 4/2012 | Abele et al. | |
| 8,175,429 B2 | 5/2012 | Tan et al. | |
| 2011/0316386 A1 | 12/2011 | Karakaya et al. | |

OTHER PUBLICATIONS

M. Rinaldi, et al., "Super-High-Frequency Two-Port AlN Contour-Mode Resonators for RF Applications", 2010, IEEE, Transactions on Ultrasonics, Ferroelectrics, and Frequency Control, vol. 57, No. 1, p. 38-45.*  
S. Yazici, et al, "Suppression of Spurious Modes via Dummy Electrodes and 2% Frequency Shift via Cavity Size Selection for 1GHz AlN MEMS Contour-Mode Resonators", 2012, IEEE , Frequency Control Symposium (FCS), p. 1-5.*  
R. Pease, et al, "Lithography and Other Patterning Techniques for Future Electronics", 2008, IEEE, Proceedings of the IEEE, vol. 96, No. 2, p. 248-270.*

(Continued)

*Primary Examiner* — Benny Lee  
*Assistant Examiner* — Albens Dieujuste  
(74) *Attorney, Agent, or Firm* — Martin I. Finston

(57) ABSTRACT

A microresonator with an input electrode and an output electrode patterned thereon is described. The input electrode includes a series of stubs that are configured to isolate acoustic waves, such that the waves are not reflected into the microresonator. Such design results in reduction of spurious modes corresponding to the microresonator.

10 Claims, 5 Drawing Sheets

(56) References Cited

OTHER PUBLICATIONS

Bircumshaw, et al., "The Radial Bulk Annular Resonator: Towards a 50 Ohm MEMS Filter", The 12th International Conference on Solid State Sensors, Actuators and Microsystems, Jun. 8-12, 2003, pp. 875-878.

Stephanou, et al., "GHZ Contour Extensional Mode Aluminum Nitride MEMS Resonators", 2006 IEEE Ultrasonics Symposium, 2006, pp. 2401-2404.

Stephanou, et al., "GHZ Higher Order Contour Mode ALN Annular Resonators", MEMS 2007, Jan. 21-25, 2007, pp. 787-790.

Piazza, et al., "Piezoelectric Aluminum Nitride Vibrating Contour-Mode MEMS Resonators", Journal of Microelectromechanical Systems, vol. 15, No. 6, Dec. 2006, pp. 1406-1418.

Piazza, "One and Two Port Piezoelectric Higher Order Counter-Mode MEMS Resonators for Mechanical Signal Processing", Department of Electrical & Systems Engineering Departmental Papers, University of Pennsylvania, 2007, pp. 1-33.

Kuypers, et al., "Green's Function Analysis of Lamb Wave Resonators", 2008 IEEE International Ultrasonics Symposium Proceedings, 2008, pp. 1548-1551.

Harrington, et al., "Toward Ultimate Performance in GHZ MEMS Resonators: Low Impedance and High Q", 2010 IEEE 23rd Conference on Micro Electro Mechanical Systems, Jan. 2010, pp. 707-710.

Shiba, et al., "Low Loss SAW Double-Mode Structure Suppressing Spurious Radiation", Proc. of the 2004 IEEE International Ultrasonics, Ferroelectrics and Freq. Cntrl. Conf., 2004, pp. 2008-2011.

\* cited by examiner

LEGEND
- Si
- SiO₂
- W
- Al
- AlN
- Al or Ti/TiN/Al

US 9,337,800 B1

MICRORESONATOR ELECTRODE DESIGN

RELATED APPLICATIONS

This application claims priority to U.S. Provisional Patent Application No. 61/546,432, filed on Oct. 12, 2011, and entitled "MITIGATION OF SPURIOUS FLEXURAL MODES IN ALUMINUM NITRIDE MICRORESONATORS". The entirety of this application is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Microresonators are relatively small acoustic resonators that can be used to form frequency filters or oscillator references. Generally, microresonators are manufactured through employment of integrated circuit (IC) manufacturing techniques, such that multiple resonators with a wide range of resonant frequencies (32 kHz to 10 GHz) can be manufactured on a single substrate. Oftentimes, microresonators are employed in connection with radio frequency band or channel selection.

Relatively recently, microresonators have become of research interest due to their small size, high quality factor (Q), CAD defined low to moderate impedance, potential monolithic integration with radiofrequency (RF) circuitry, and ability to realize multiple frequency filters operating from 10 kHz to 10 GHz on a single chip. The realization of numerous (tens to hundreds) multiple frequency filters on a single substrate can reduce component count in wireless handsets and enable frequency bandwidth and waveform diverse cognitive radios.

While impedance and frequency of desired extensional modes in microresonators can be relatively accurately adjusted using known equations and reduced order finite element models to synthesize a variety of different filter architectures, spurious modes arising from multiple sources may degrade the ultimate filter performance.

SUMMARY

The following is a brief summary of subject matter that is described in greater detail herein. This summary is not intended to be limiting as to the scope of the claims.

Described herein are various technologies pertaining to microresonators. With more particularity, described herein are exemplary designs of electrodes on acoustic microresonators that facilitate reduction of spurious modes associated with conventional acoustic microresonators. An acoustic microresonator described herein can be manufactured utilizing integrated circuit (IC) manufacturing techniques, thereby allowing the acoustic microresonator to be relatively small, such as on the order of less than 500 μm in length, less than 100 μm in width, and less than 10 μm in thickness.

An exemplary microresonator comprises a plurality of layers: a first layer that is composed of a metal (such as aluminum); a 2nd layer that is composed of piezoelectric film (such as an aluminum nitride film); and a 3rd layer composed of a metal (such as aluminum). The second layer is disposed between the first layer and the third layer. The first layer comprises an input electrode that receives electric current from a source or from a connected element, such as another microresonator. The first layer further comprises an output electrode, wherein electric current exits the micro-resonator (e.g., where such electric current is received by a connected element, such as another microresonator). The third layer, in an exemplary embodiment, can comprise an electrode that is grounded. In operation, an electric field can be applied across the second layer (the piezoelectric film), which induces displacement of the piezoelectric film by way of the piezoelectric effect. The input electrode can be employed to drive acoustic resonance of the microresonator, while the output electrode can be employed in connection with sensing acoustic resonance of the microresonator.

The input electrode comprises a first interconnect bus that is employed to electrically connect the microresonator with another element. The input electrode further comprises a first plurality of fingers that extend orthogonally from the first interconnect bus. Accordingly, fingers in the first plurality of fingers are in parallel with one another. Each finger in the first plurality of fingers can have a first length. The input electrode also comprises a plurality of stubs that extend orthogonally from the first interconnect bus, such that stubs in the first plurality of stubs are in parallel with one another and also in parallel with fingers in the first plurality of fingers. Each stub in the first plurality of stubs has a second length, wherein the second length is less than the first length (the length of fingers in the first plurality of fingers).

In an exemplary embodiment, stubs in the first plurality of stubs are disposed adjacent to fingers in the first plurality of fingers along the first interconnect bus. Accordingly, no finger in the first plurality of fingers is adjacent to any other finger in the first plurality of fingers along the first interconnect bus; rather, any two fingers are separated by a stub. Similarly, stubs are not immediately adjacent to one another along the first interconnect bus; instead, any two stubs are separated by a finger.

The output electrode of the first layer of the acoustic microresonator comprises a second interconnect bus that is parallel to the first interconnect bus. Additionally, the first plurality of fingers and the first plurality of stubs extend from the first interconnect bus towards the second interconnect bus. The output electrode also includes a second plurality of fingers that extend orthogonally from the second interconnect bus towards the first interconnect bus. The output electrode also comprises a second plurality of stubs that extend orthogonally from the second interconnect bus towards the first interconnect bus, such that the first plurality of fingers, the first plurality of stubs, the second plurality of fingers, and the second plurality of stubs are in parallel with one another.

Each finger in the second plurality of fingers has a length that is greater than respective lengths of stubs in the second plurality of stubs. The output electrode is structured in a similar manner to the input electrode (e.g., rotated 180 degrees). Accordingly, no two fingers are adjacent to one another along the second interconnect bus, and no two stubs are adjacent to one another along the second interconnect bus. Rather, any two fingers are separated by a stub, and any two stubs are separated by a finger.

Further, fingers in the first plurality of fingers are substantially aligned with stubs in the second plurality of stubs. Likewise, fingers in the second plurality of fingers are substantially aligned with stubs in the first plurality of stubs. The selective inclusion and placement of the stubs in the input electrode and the output electrode facilitate prevention of reflectance of acoustic waves into the acoustic microresonator, thereby facilitating prevention of spurious modes. Further, each finger in the first plurality of fingers and second plurality of fingers and each stub in the first plurality of stubs and the second plurality of stubs can have rounded ends (such that sharp corners are avoided). The structure of the electrode results in increased accuracy and reliability when the acoustic microresonator is employed as a filter mechanism, for example, in a mobile communications device.

Other aspects will be appreciated upon reading and understanding the attached figures and description.

DETAILED DESCRIPTION

Figure 1:
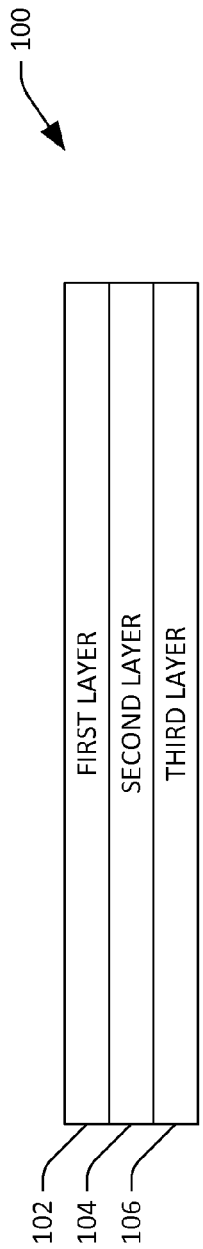
FIG. 1 is a cross-sectional view of an exemplary microresonator.

Various technologies pertaining to acoustic microresonators will now be described with reference to the drawings, where like reference numerals represent like elements throughout. Additionally, as used herein, the term "exemplary" is intended to mean serving as an illustration or example of something, and is not intended to indicate a preference.

With reference now to FIG. 1, a cross-sectional view of an exemplary acoustic microresonator 100 is illustrated. Pursuant to an example, the microresonator 100 can be of a relatively small size, such as on the order of 500 μm in length, 150 μm in width, and 10 μm in thickness. For instance, the microresonator 100 can be less than 300 μm in length, less than 70 μm in width, and less than 2 μm in thickness.

The microresonator 100 comprises a first layer 102, a second layer 104, and a third layer 106, such that the second layer 104 is disposed between the first layer 102 and the third layer 106. In an exemplary embodiment, the first layer 102 and the third layer 106 can be composed of a conductive material, such as a metal. For example, such metal can be aluminum (Al), although other metals are contemplated and are intended to fall under the scope of the hereto-appended claims. In another exemplary embodiment, the first layer 102 and/or the third layer 106 can be composed of titanium (Ti), titanium nitride (TiN), tungsten (W), or some combination thereof.

The second layer 104 can be a piezoelectric film, which can be composed of a suitable piezoelectric material. In an exemplary embodiment, the second layer 104 can be composed of aluminum nitride (AlN). It is to be understood, however, that other piezoelectric materials are contemplated by the inventors and are intended to fall under the scope of the hereto-appended claims. For example, the second layer 104 can be composed of zinc oxide (ZnO), lead zirconate titanate (PZT), lithium niobate (LiNbO), lithium tantalate (LiTaO$_3$), quartz, barium strontium titanate, or other suitable piezoelectric material.

As will be described in greater detail below, the first layer 102 can include an input electrode and an output electrode. The third layer 106 may also comprise an electrode that is grounded; such electrode can be referred to as a "bottom electrode". Application of an electric field across the second layer 104 causes displacement to occur in the second layer 104 by way of the piezoelectric effect. Such electric field can be generated via transition of electric current through the input electrode. The output electrode of the first layer 102 can be employed to sense resonance of the second layer 104 induced by the electric field across the second layer 104. Additionally, while not shown in FIG. 1, the microresonator 100 is suspended above a substrate upon which the microresonator 100 is forded by an air or vacuum gap; the plate thickness is on the order of one acoustic wavelength (or less) at resonance. Furthermore, in an exemplary embodiment, the microresonator 100 need not include the bottom electrode.

As will be described in greater detail below, the acoustic microresonator 100 can be fabricated through conventional integrated circuit (IC) fabrication techniques. The acoustic microresonator 100 can be employed in a variety of applications. For example, the acoustic microresonator 100 can be a portion of a filter that is utilized in connection with detecting electromagnetic frequencies, such as those used to transmit communications to and from mobile communications devices. Further, the acoustic microresonator 100 can be comprised by a chip that includes numerous (tens to hundreds) of microresonators, wherein such microresonators may have differing resonant frequencies (e.g., between 32 kHz and 10 GHz). It is therefore to be understood that the microresonator 100 can be comprised by a suitable mobile communications device, such as a mobile telephone, a military communications device, or the like.

Figure 2:
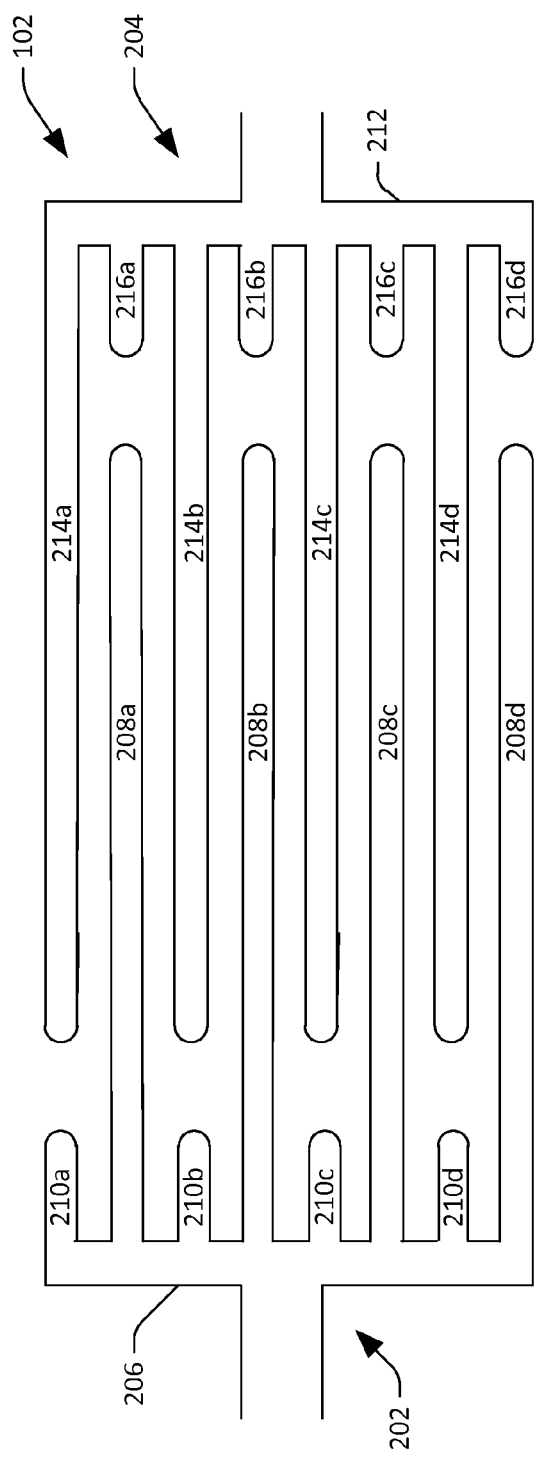
FIG. 2 is an overhead view of an input electrode and an output electrode included in an exemplary acoustic microresonator.

With reference now to FIG. 2, an overhead view of the first layer 102 of the microresonator 100 is shown. As noted above, the first layer 102 comprises an input electrode 202 and an output electrode 204. The input electrode 202 comprises a first interconnect bus 206. A first plurality of fingers 208a-208d (collectively referred to as 208) extend orthogonally from the first interconnect bus 206. Each finger in the first plurality of fingers 208 has a first length; in an exemplary embodiment, lengths of the fingers can depend upon a desired resonant frequency of the acoustic microresonator 100. For example, each finger in the first plurality of fingers 208 can have a same length.

The input electrode 202 further comprises a first plurality of stubs 210a-210d (collectively referred to as 210). The first plurality of stubs 210 extends orthogonally from the first interconnect bus 206 in parallel with the first plurality of fingers 208. As can be ascertained, no two stubs in the first plurality of stubs 210 are adjacent to one another along the first interconnect bus 206; rather, two stubs in the first plurality of stubs are separated by a respective one of the fingers in the first plurality of fingers 208. Likewise, no two fingers in the first plurality of fingers 208 are directly adjacent to one another along the first interconnect bus 206; rather, two fingers are separated by a respective stub in the first plurality of stubs 210.

The output electrode 204 comprises a second interconnect bus 212 that is parallel to the first interconnect bus 206. The first plurality of fingers 208 and the first plurality of stubs 210 extend from the first interconnect bus 206 towards the second interconnect bus 212. The output electrode 204 additionally comprises a second plurality of fingers 214a-214d (collectively referred to as 214). The second plurality of fingers 214 extend orthogonally from the second interconnect bus 212 towards the first interconnect bus 202.

The output electrode 204 additionally comprises a second plurality of stubs 216a-216d (collectively referred to as 216) that extend orthogonally from the second interconnect bus 212 in parallel with the second plurality of fingers 214 towards the first interconnect bus 206. As can be ascertained, stubs in the second plurality of stubs 216 respectively have a length that is less than a length of the fingers in the second plurality of fingers 214. Pursuant to an example, length of stubs in the second plurality of stubs 216 can be equivalent to lengths of the stubs in the first plurality of stubs 210. Likewise, lengths of the fingers in the first plurality of fingers 208 can be equivalent to lengths of the fingers in the second plurality of fingers 214.

Further, stubs in the first plurality of stubs 210 are in substantial alignment with fingers in the second plurality of fingers 214, and fingers in the first plurality of fingers 208 are in substantial alignment with stubs in the second plurality of stubs 216. Accordingly, in an example, the stub 210a is in alignment with the finger 214a, wherein the stub 210a and the finger 214a are separated by a gap of a particular length. Likewise, the stub 210b is in alignment with the finger 214b, wherein the stub 210b and the finger 214b are separated by a gap of the particular length. Similarly, fingers in the first plurality of fingers 208 are in alignment with respective stubs in the second plurality of stubs 216. Thus, the finger 208a is in alignment with the stub 216a, and the finger 208a and the stub 216a are separated by a gap of the particular length.

As shown, ends of fingers in the first plurality of fingers 208, ends of fingers in the second plurality of fingers 214, ends of stubs in the first plurality of stubs 210, and ends of stubs in the first plurality of stubs 216 can have rounded edges (to avoid sharp corners).

The design of the input electrode 202 and the output electrode 204 has been experimentally shown to reduce interactions of the acoustic wave generated by the microresonator 100 with the first interconnect bus 206 and the second interconnect bus 212. Particularly, the acoustic wave generated by the microresonator 100 is isolated from the interconnect buses 206 and 212. Such design does not completely eliminate all spurious modes when compared to the standard design of acoustic microresonators; however, many of the spurious modes are removed while several others are significantly rejected. Removal of these modes also incrementally improves both the motional impedance and quality factor.

To demonstrate the impact of removing spurious modes on filter synthesis, a two pole filter was generated in an experiment by placing two microresonators in series. The coupling between the microresonators, which determines the filter bandwidth, was achieved using the shunt capacitance inherent in the resonator. Four of these filters were placed in parallel to reduce the insertion loss into a fifty ohm termination impedance.

Figure 3:
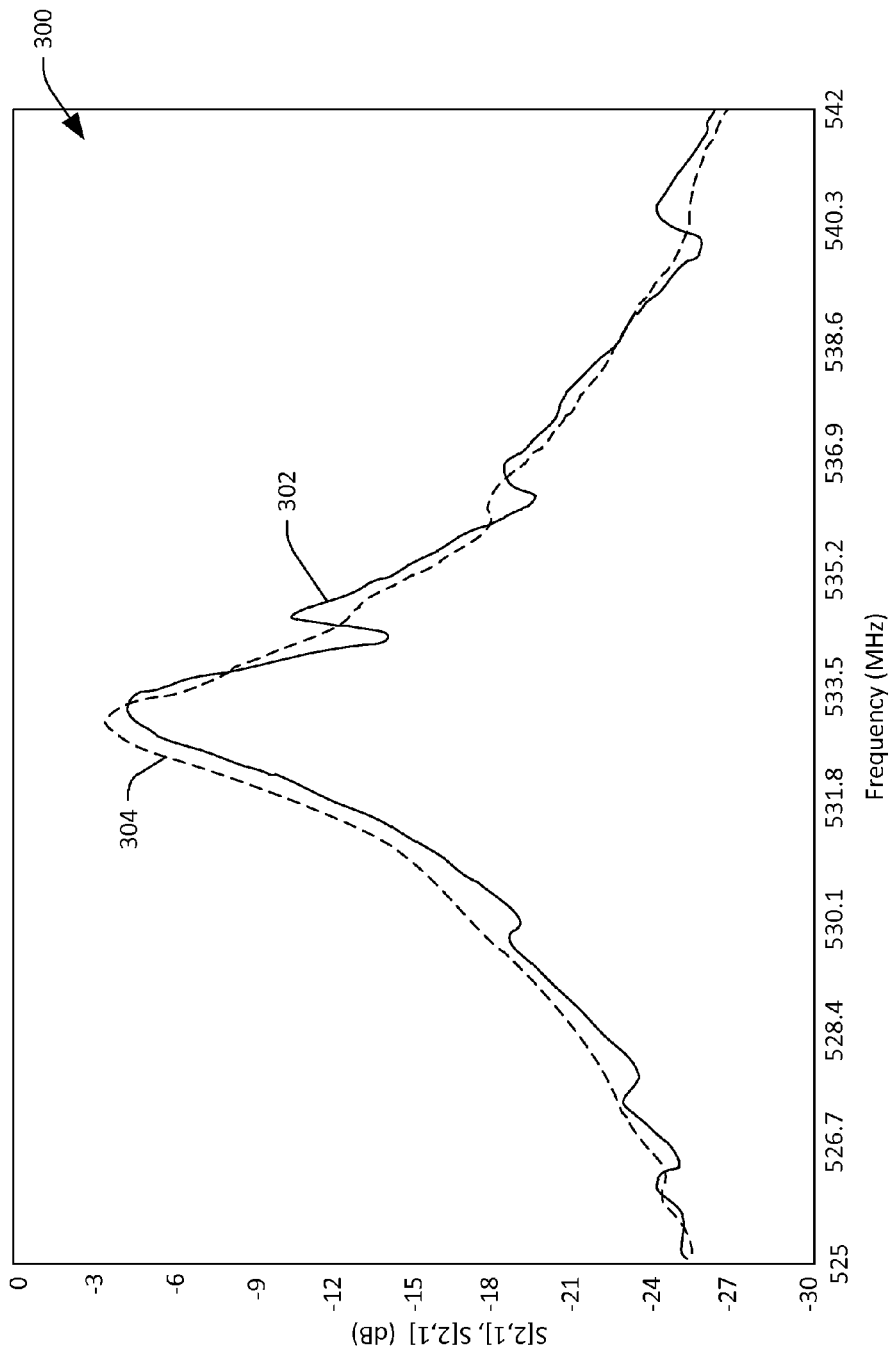
FIG. 3 is an exemplary graph illustrating a reduction of spurious modes corresponding to a microresonator with input and output electrodes structured as shown in FIG. 2.

Now referring to FIG. 3, an exemplary graph 300 illustrating measured responses of 50 ohm, 533 MHz width extensional microresonators is illustrated. Line 302 represents a response of a conventional microresonator design, which includes numerous spurs. Line 304 represents a response of a microresonator design that includes the input and output electrode structured as shown in FIG. 2.

Figure 4:
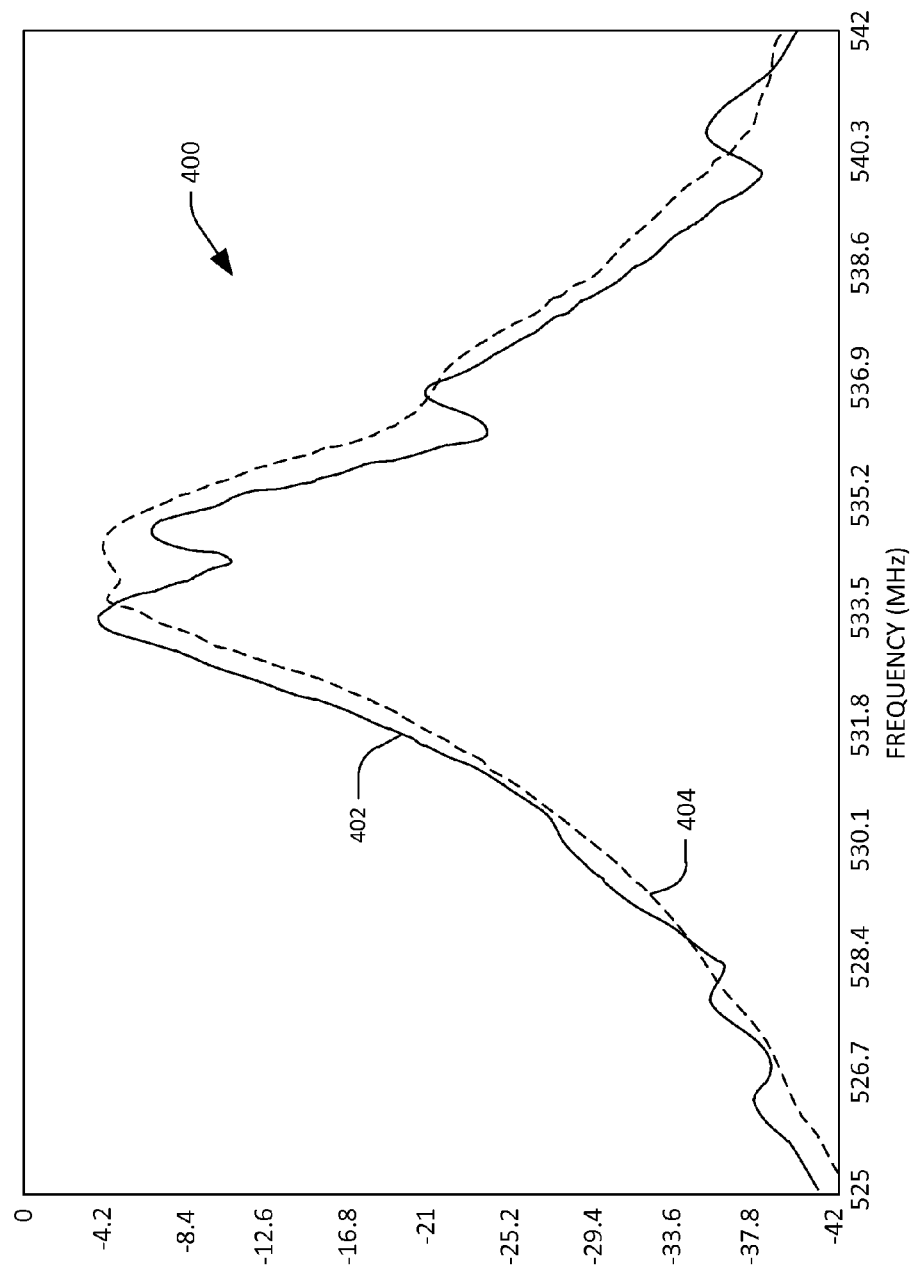
FIG. 4 is an exemplary graph illustrating a reduction of spurious modes corresponding to a microresonator utilized in a two pole filter, wherein microresonators in the two pole filter have input and output electrodes structured as shown in FIG. 2.

Turning briefly to FIG. 4, a graph 400 illustrating reduction of spurious modes in a filter that includes the microresonator 100 is illustrated. Data for the graph 400 corresponds to a width extensional aluminum nitride microresonator operating at 533 MHz. A first line 402 illustrates spurious modes of microresonators with conventional input and output electrode designs, while a 2nd line 404 illustrates a measured response of an electrically coupled filter design realized utilizing resonators with input and output electrode design as shown in FIG. 2.

Figure 5A:
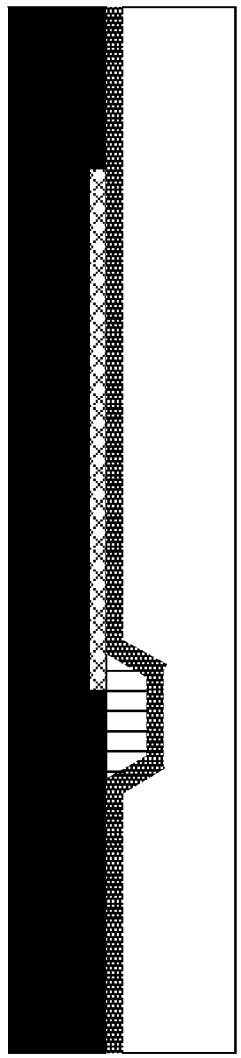
FIGS. 5A-5C illustrate an exemplary process for fabricating an acoustic microresonator.
Figure 5B:
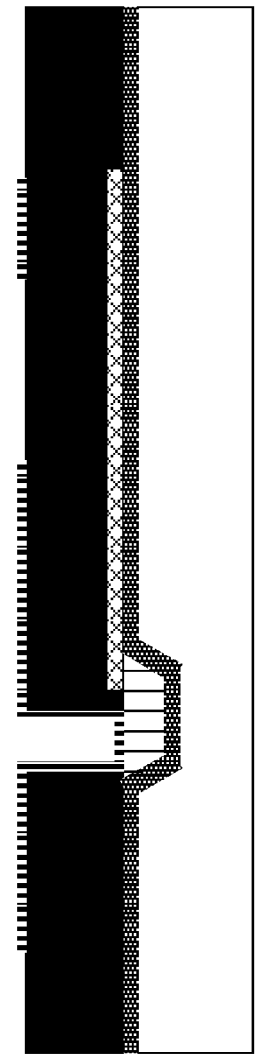
Figure 5C:
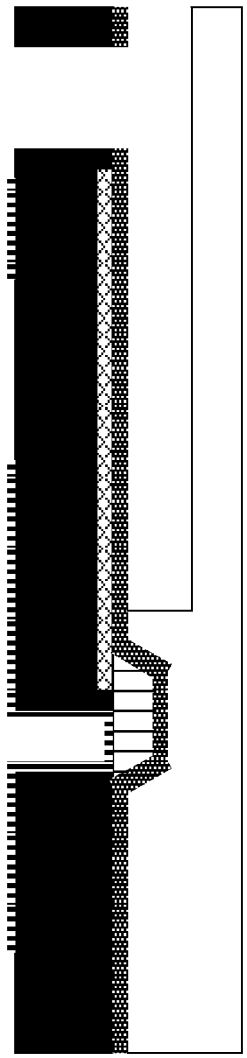

Referring now to FIGS. 5A-5C, an exemplary fabrication process for fabricating the microresonator 100 is illustrated. With reference to FIG. 5A, the fabrication process begins with an anisotropic silica (Si) etch and the deposition of a silicon dioxide ($SiO_2$) layer to isolate the bottom electrode in the third layer 106 from the substrate. Tungsten (W) can then be deposited by chemical vapor deposition and can be chemically mechanically polished until W remains only where the Si was etched. An oxide touch polish may then be performed to further smooth the wafer surface prior to the sputter deposition and patterning of the bottom electrode in the third layer 106. Two separate bottom electrode processes are described: a first process with a 50 nm Al bottom electrode; and a second process that utilizes Ti(20 nm)/TiN(50 nm)/Al(50 nm). Subsequently, 750 nm of AlN is sputter deposited at 350° C. Using such process, highly oriented c-axis AlN films used for realizing low impedance resonators can be reliably formed.

Typical rocking curve full width half maximum values for the AlN film measured using x-ray diffraction are 3.1° on aluminum and 1.5° Ti/TiN/Al. In an exemplary embodiment, resonators realized using the more highly oriented AlN on Ti/TiN/Al exhibit 2.25 times lower impedance when compared to identical resonators on an Al bottom electrode.

Referring now to FIG. 5B, contacts to the W area are etched in the AlN, and a 100 nm thick Al top electrode is deposited and patterned (in the pattern shown in FIG. 2).

Turning to FIG. 5C, the resonator frequency is lithographically defined by etching trenches in the AlN and $SiO_2$ to bulk Si, and the devices are released using an isotropic etch in dry $SF_6$ or $XeF_2$. In this exemplary process, the maximum temperature is 350° C. and the materials are post-CMOS compatible and can be deposited and etched using standard CMOS tools.

Experimentally, for the following film thicknesses, in the range of 400-600 MHz, a stub length and stub spacing to the input and output electrodes of (¾)*acoustic wavelength was found to be substantially optimal: $SiO_2$=825 nm; Ti/TiN/Al= (20/50/100 nm); AlN=750 nm; Al/TiN=200/50 nm;

Additionally, for a temperature compensated microresonator in the 400-600 MHz frequency range with the material thicknesses set forth below, a stub length and stub spacing to the electrodes of (5/4)*acoustic wavelength was found to be substantially optimal: $SiO_2$=1500 nm; Ti/TiN/Al=(20/25/50 nm); AlN=750 nm; Al/TiN=100/25 nm.

Figure 6:
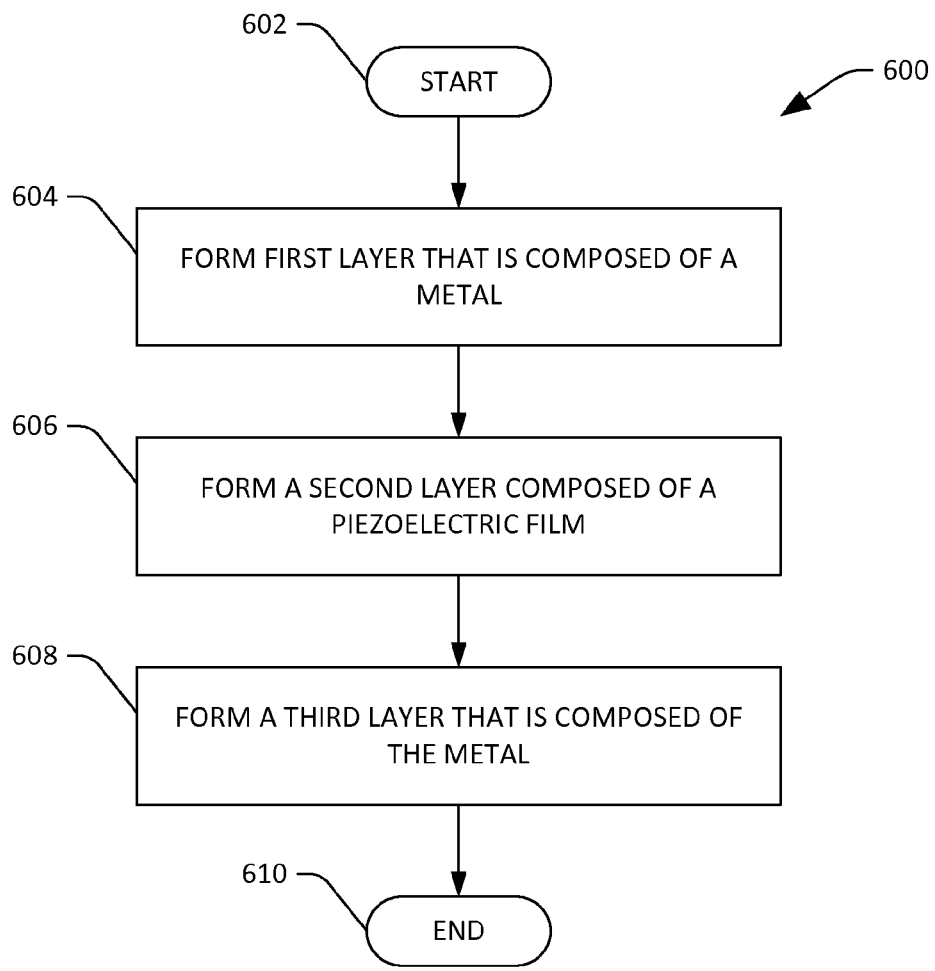
FIG. 6 is a flow diagram that illustrates an exemplary methodology for fabricating an acoustic microresonator.

With reference now to FIG. 6, an exemplary methodology 600 is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement a methodology described herein.

The exemplary methodology 600 facilitates forming an acoustic microresonator. The methodology 600 starts at 602, and at 604 a first layer that is composed of a metal is formed. At 606, a second layer that is composed of piezoelectric film is formed. For instance, the piezoelectric film can be AlN. At 608, a third layer is formed that is composed of metal (e.g., the same metal that is used to form the first layer), wherein the second layer is disposed between the first layer in the second layer.

The first layer is formed to comprise an input electrode and an output electrode, wherein the input electrode comprises a first interconnect bus and a first finger that extends orthogonally from the first interconnect bus. The first finger has a first length. The input electrode further comprises a first stub that extends orthogonally from the first interconnect bus parallel to the first finger. The first stub has a second length, wherein the first length is greater than the second length. The methodology 600 completes at 610.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. An acoustic width-extensional microresonator having at least one operating frequency f, comprising:
    a first layer composed of a metal;
    a second layer composed of the metal; and
    a third layer composed of a piezoelectric film, wherein the third layer is disposed between the first layer and the second layer, the first layer formed to comprise an input electrode and an output electrode, wherein the input electrode comprises:
    a first interconnect bus;
    a first plurality of fingers that extend orthogonally from the first interconnect bus, each finger in the first plurality of fingers having a first length; and
    a first plurality of stubs that extend orthogonally from the first interconnect bus, each stub in the first plurality of stubs having a second length, the second length being less than the first length, wherein the acoustic microresonator has a size of less than 500 μm in length, 150 μm in width, and 10 μm in thickness;
    and wherein the output electrode comprises:
    a second interconnect bus in parallel with the first interconnect bus, wherein the first plurality of fingers extend from the first interconnect bus toward the second interconnect bus;
    a second plurality of fingers that extend orthogonally from the second interconnect bus toward the first interconnect bus, each finger in the second plurality of fingers having the first length; and
    a second plurality of stubs that extend orthogonally from the second interconnect bus toward the first interconnect bus, each stub in the second plurality of stubs having the second length, the first and second plurality of stubs and the first and second plurality of fingers being arranged such that each finger of the first plurality of fingers opposes a respective stub of the second plurality of stubs across a first gap and each finger of the second plurality of fingers opposes a respective stub of the first plurality of stubs across a second gap.

2. A chip comprising a plurality of acoustic microresonators, in which the width-extensional acoustic microresonator of claim 1 is included in the plurality of acoustic microresonators.

3. A frequency filter comprising the width-extensional acoustic microresonator of claim 1.

4. The width-extensional acoustic microresonator of claim 1, wherein the metal is aluminum.

5. The width-extensional acoustic microresonator of claim 1, wherein the piezoelectric film is composed of aluminum nitride.

6. The width-extensional acoustic microresonator of claim 1, wherein the gaps between the first and second plurality of fingers and their respective first and second plurality of stubs have a length equal to the second length.

7. The width-extensional acoustic microresonator of claim 1, wherein the operating frequency f corresponds to an acoustic wavelength and wherein the second length lies in the range from 0.75 to 1.25 times the acoustic wavelength at the operating frequency.

8. The width-extensional acoustic microresonator of claim 1, wherein the first plurality of fingers consists of four fingers, and wherein the first plurality of stubs consists of four stubs.

9. A mobile communications device comprising the width-extensional acoustic microresonator of claim 1.

10. The mobile communications device of claim 9, being a mobile telephone.

* * * * *